US005637351A

United States Patent [19]
O'Neal et al.

[11] Patent Number: 5,637,351
[45] Date of Patent: Jun. 10, 1997

[54] CHEMICAL VAPOR DEPOSITION (CVD) OF SILICON DIOXIDE FILMS USING OXYGEN-SILICON SOURCE REACTANTS AND A FREE RADICAL PROMOTER

[75] Inventors: Harry E. O'Neal; Morey A. Ring, both of San Diego; John G. Martin, El Cajon, all of Calif.

[73] Assignee: Air Products and Chemicals, Inc., Allentown, Pa.

[21] Appl. No.: 439,349

[22] Filed: May 11, 1995

[51] Int. Cl.⁶ .................................... C23C 16/40
[52] U.S. Cl. .......................................... 427/255.3
[58] Field of Search ........................ 427/126.3, 248.1, 427/255.3

[56] References Cited

U.S. PATENT DOCUMENTS

| | | | |
|---|---|---|---|
| 4,981,724 | 1/1991 | Hochberg et al. | 427/255.3 |
| 4,988,533 | 1/1991 | Freeman et al. | 427/38 |
| 5,068,124 | 11/1991 | Batey et al. | 427/39 |
| 5,360,646 | 11/1994 | Morita | 427/574 |

FOREIGN PATENT DOCUMENTS 519079  12/1992  European Pat. Off. .

OTHER PUBLICATIONS

Patent Abstracts of Japan, vol. 008, No. 212, (C–244), 27 Sep. 1984.
"Chemical Vapor Deposition of SiO2 From Ozone–Organosilane Mixtures Near Atmospheric Pressure", Mat. Res. Soc. Symp. Proc., vol. 282, 1993, pp. 575–580. (month unavailable).

*Primary Examiner*—Benjamin Utech
*Assistant Examiner*—Timothy H. Meeks
*Attorney, Agent, or Firm*—Geoffrey L. Chase

[57] ABSTRACT

A low temperature chemical vapor deposition method for depositing silicon dioxide comprising the steps of heating a substrate upon which deposition is desired to a temperature of between 250° C. (482° F.) and 420° C. (788° F.) in a vacuum having a pressure of from about 0.1 to about 2.0 torr and introducing, together with a silane and oxygen or oxygen-containing silane, a free radical promoter (e.g., di-t-butylperoxide, t-butylhydroperoxide, or n-butylnitrite) as a co-reactant into the vacuum.

12 Claims, 1 Drawing Sheet

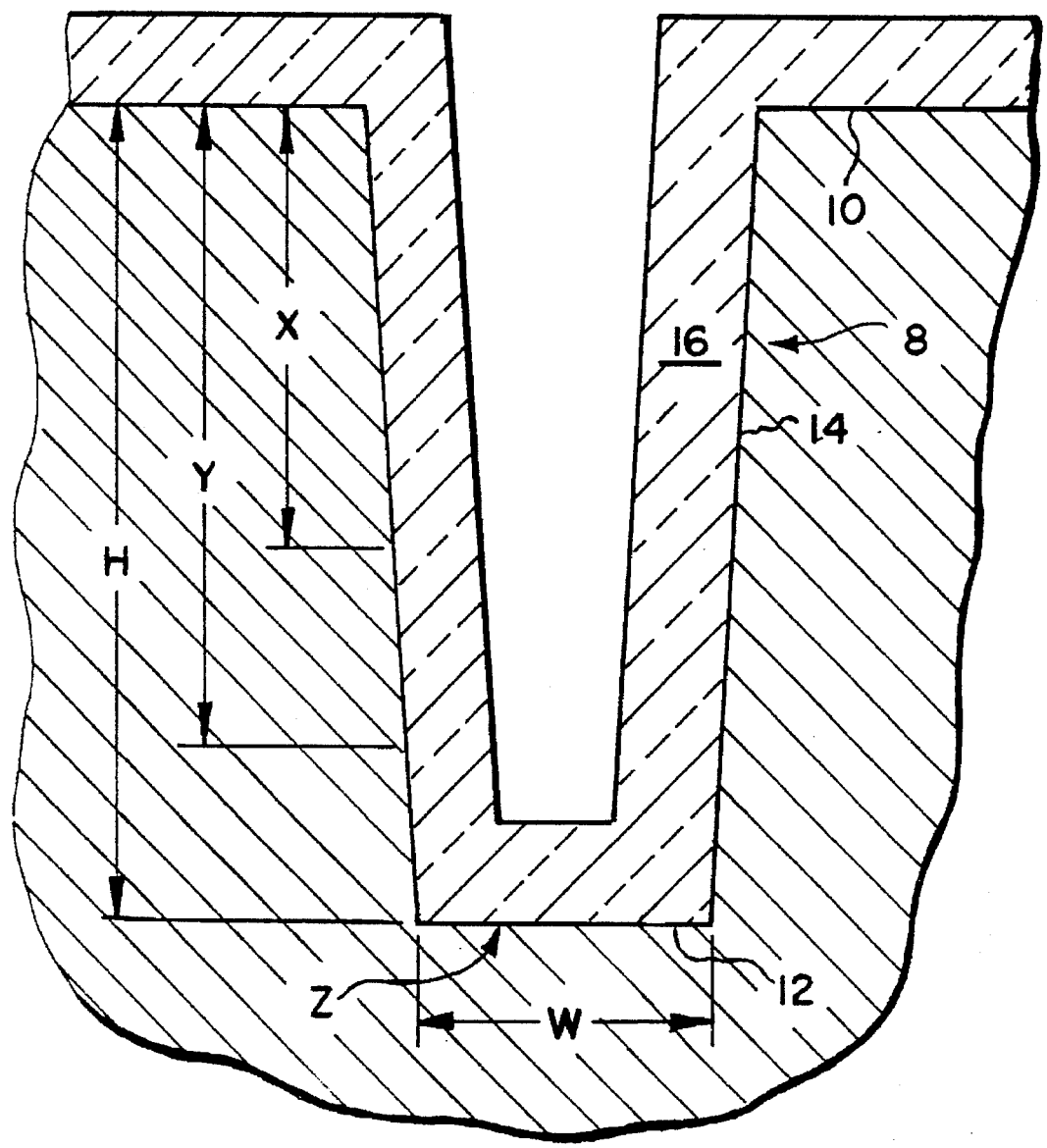

CHEMICAL VAPOR DEPOSITION (CVD) OF SILICON DIOXIDE FILMS USING OXYGEN-SILICON SOURCE REACTANTS AND A FREE RADICAL PROMOTER

TECHNICAL FIELD OF THE INVENTION

This invention relates to the manufacture of devices that require chemical vapor deposition of silicon dioxide films or coatings as part of their fabrication process, with particular application to manufacture of semiconductor devices, but not limited thereto.

BACKGROUND OF THE INVENTION

U.S. Pat. No. 4,981,724 discloses and claims a process for chemically vapor depositing silicon oxide on a heated substrate utilizing a silane selected from the group consisting of alkylsilane, arylsilane, alkoxysilanes, alkynylsilane, and aralkylsilane reacted with oxygen. Among other things, the process of the patent requires the substrate being heated to a minimum temperature of 325° C. in order to effect deposition.

The semiconductor industry is constantly in search of ways to reduce the minimum temperatures required for safe chemical vapor deposition to provide silicon dioxide films under conditions of high deposition rates and good film quality. This lower temperature requirement is necessitated by materials of construction for substrates, such as aluminum and/or plastics.

The aforementioned patent is an attempt to lower the temperature of deposition in order to accommodate some of the newer substrates. In fact, the patentees discovered that the use of diethylsilane in the presence of oxygen would result in a satisfactory deposition of silicon dioxide at a minimum substrate temperature of 325° C. (620° F.).

In the past, there have been attempts to identify promoters for use with silicon dioxide precursors in order to enhance the silicon dioxide deposition process. Ozone has been used to promote silicon dioxide deposition from tetraethoxysilane (TEOS)-oxygen systems and tetramethylsilane-oxygen systems, as reported by K. V. Guinn and J. A. Mucha in "Chemical Vapor Deposition of SiO$_2$ From Ozone-Organosilane Mixtures Near Atmospheric Pressure", Mat. Res. Soc, Symp. Proc., Vol. 282, 1993, pp. 575–580. However, the use of ozone requires the use of a separate ozone generator and is an environmental concern for operators.

SUMMARY OF THE INVENTION

It has been discovered that introducing a free radical promoter selected from the group consisting of peroxides, hydroperoxides, alkylnitrites and mixtures thereof into a reactor wherein oxygen-silicon source reactant(s) are present, the promoter being selected to have a lifetime approximately equal to the residence time of the oxygen-silicon source reactant(s) results in enhanced deposition of silicon dioxide on the substrate. Enhancement of the method can be an accelerated deposition rate at known conditions of temperature pressure and reactant flow rates and a minimum deposition temperature of 250° C. (482° F.). The method can be enhanced without sacrificing film quality or deposition rates for the silicon dioxide. Promoters can be used with silane sources selected from the group consisting of alkylsilane, arylsilane, aralkylsilane, and alkoxysilane.

In particular, the use of di-t-butylperoxide, t-butylhydroperoxide and n-butylnitrite are effective as promoters for silicon dioxide deposition when using the diethylsilane-oxygen (DES-O$_2$) reactants, such as disclosed in U.S. Pat. No. 4,981,724. Utilizing these promoters permits a minimum deposition temperature of 250° C. without sacrificing deposition rate or as-deposited film quality.

BRIEF DESCRIPTION OF THE DRAWING

The single drawing is a schematic representation of a silicon dioxide coated substrate trench used to determine silicon dioxide film conformality.

DESCRIPTION OF THE PREFERRED EMBODIMENT

The process of U.S. Pat. No. 4,981,724 led to the development of the diethylsilane-oxygen (DES-O$_2$) system for depositing silicon dioxide on a substrate at a lower than conventional temperature without sacrificing film quality or deposition rate. A minimum temperature of 325° C., consistent with good film quality has been achieved by this process. Lower temperatures require high pressures that produce poor quality (powdery) films.

According to the present invention, the use of oxygen-silicon source reactant(s) in combination with a free radical promoter, selected from the group consisting of peroxides, hydroperoxides, alkylnitrites and mixtures thereof facilitate accelerated deposition of silicon dioxide in a chemical vapor deposition process. In addition, the process permits lowering of the reaction temperature without sacrificing film quality or film deposition rate. The lower limit of the deposition temperature is determined by the promoter used.

For the purposes of the present invention, the term, oxygen-silicon source reactant(s), shall mean a single reactant which functions as the combined source of oxygen and silicon necessary for silicon dioxide film formation, such as tetraethoxysilane (TEOS), as well as a combination of reactants which function as the sources of oxygen and silicon necessary for silicon dioxide film formation, such as gaseous oxygen as a discrete source of oxygen reactant and diethylsilane as a discrete source of silicon reactant. TEOS can be used as a single oxygen-silicon source reactant without an external source of oxygen or as a component of oxygen-silicon source reactants with a discrete source of oxygen for the silicon dioxide formation.

The silicon source reactant component of the oxygen-silicon source reactant(s) is preferably a silane selected from the group consisting of alkylsilane, arylsilane, alkoxysilane and aralkylsilane wherein the alkyl-, aryl, alkoxy- or aralkyl-moiety comprises from 2–6 carbons. Typical silanes include tetraethoxysilane, diethylsilane, tetramethylsilane, tertiarybutylsilane, ethylpropyl-t-butylsilane, diethyl-di-t-butylsilane, ethylpropylazidosilane, tetraethylsilane, tripropylsilane, phenylsilane and cyclohexylsilane. It is possible to include non-carbon atoms or heteroatoms in the alkyl-, aryl-, alkoxy- or aralkyl- moiety, such as a halogen, oxygen, nitrogen, or a functional group, such as amino. It is preferable to have an alkylsilane with the alkyl moiety having 2–4 carbons. It is possible to use a mixture of silanes in the silicon dioxide deposition reaction.

In particular, the oxygen-diethylsilane method that is currently in use by a number of semiconductor manufacturers can be enhanced using the present invention by including a promoter, which is a source of free radicals or promotes free radicals in the reactant(s), comprising peroxides, hydroperoxides, nitrites and mixtures thereof. More preferably, the promoter is selected from the group consisting of di-t-butylperoxide (t-buO)$_2$, t-butylhydroperoxide (t-buOOH), n-butylnitrite (n-buNO$_2$) and mixtures thereof. The use of such promoters allows lower process temperatures than would otherwise be acheivable, while maintaining desired deposition rates and favorable film properties. For instance, using (t-buO)$_2$, the silicon dioxide deposition temperature may be reduced below 250° C.

For example, the processes for di-t-butyl-peroxide catalysis of diethylsilane can be determined by the following calculations:

The rate constant for decomposition, k, is given in Equation 1 by $$k = A \exp(-E_A/RT) \quad (1)$$

where $A = 10^{15.6}$ and $E_A = 37400$ cal/mol. The lifetime is 1/k:

| Temperature (°C.) | Lifetime (seconds) |
| --- | --- |
| 280 | 0.152 |
| 260 | 0.545 |
| 250 | 1.07 |
| 240 | 2.16 |

The residence time, $t_r$, is given in Equation 2 by $$t_r = \text{volume/flow} = (\text{volume})(P/760)(273/T)(60/Q) \text{ seconds} \quad (2)$$

with flowrate Q in sccm, reactor pressure P in torr, and reactor temperature T in ° K.

Experiments were performed in cylindrical, laboratory sized, stirred flow reactors with volumes of 129 cm$^3$. For these reactors, Equation 2 may be simplified to Equation 3:

$$t_r = 2780 \, P/(TQ) \quad (3)$$

To set reactor conditions so that the residence times of gases in the heated zone are close to the lifetime of the peroxide, we substitute the peroxide lifetime at temperature T for $t_r$ in Equation 3. This gives ratios of flow to pressure (Q/P) required at each temperature. The following shows the reactor pressures, P, required for flows of 5 sccm, P(5 sccm), and 20 sccm, P(20 sccm):

| Temperature (°C.) | Q/P | P(5 sccm) | P(20 sccm) |
| --- | --- | --- | --- |
| 280 | 33.1 | 0.15 torr | 0.60 torr |
| 260 | 9.57 | 0.52 | 2.1 |
| 250 | 4.97 | 1.0 | 4.0 |
| 240 | 2.51 | 2.0 | 8.0 |

These calculations show that it may be possible to deposit silicon dioxide films at very low temperatures by increasing the pressure as the temperature is reduced. However, film quality and deposition uniformity degrade at higher pressures in this reactor due to homogeneous nucleation (silica powder formation).

Silicon strips [p-type, (100) orientation, 10–20 sq cm], were inserted into the reactor for gathering film deposition rate, film quality, and deposition conformality data. Gas product analyses were made by gas chromatography (Varian 1400, equipped with a thermal conductivity detector) using Supelco SPB-1, molecular sieve, and Poropak T and Q columns. Additional analysis were obtained by GC/MS with a Finnigan model 3000.

Initial experiments with CO$_2$ additions confirmed that this additive did not affect deposition results. A fixed amount of CO$_2$ was then added in each experiment to provide an internal reference for quantification of the gas product analyses.

Set forth in Table 1 is a series of experiments wherein silicon dioxide deposition rate was determined utilizing di-t-butylperoxide as an additive. The temperature of deposition was 250° C., and the residence time was 1.0 second for all data. Add/DES is the volume flow ratio of di-t-butylperoxide to diethylsilane in the reactor. Although the experimental di-t-butylperoxide to diethysilane volume flow ratio is set forth in Table 1, it is contemplated that the di-t-butylperoxide to diethysilane volume flow ratio can be from 0.1 to 2.0. O$_2$/DES is the volume flow ratio of oxygen to DES. DepRte is the silicon dioxide deposition rate in Angstroms per minute. R.I. is the film refractive index at 632.8 nm as measured by ellipsometry (Gaertner L119 and Rudolph EL IV). % Des Convt. is the percentage of DES reacted as measured by gas chromatography. For reference, there was no deposition at 250° C. without the additive.

| Add/ DES | O$_2$/ DES | Total Flow sccm | Dep-Rte A/ min | Film Thick A | R.I. | P$_{total}$ Torr | % DES Convt | Run # |
| --- | --- | --- | --- | --- | --- | --- | --- | --- |
| 0.17 | 4.0 | 7.00 | 78 | 3500 | — | 1.32 | 25 | 110 |
| 0.20 | 2.0 | 5.00 | 91 | 3095 | 1.43 | 0.88 | 23 | 59 |
| 0.33 | 1.0 | 3.42 | 47 | 1500 | — | 0.64 | 9 | 111 |
| 0.33 | 2.0 | 4.70 | 75 | 2100 | — | 0.88 | 20 | 112 |
| 0.33 | 3.0 | 5.98 | 82 | 1850 | — | 1.12 | 29 | 113 |
| 0.33 | 3.0 | 6.00 | 92 | 2200 | — | 1.12 | 28 | 117 |
| 0.33 | 3.0 | 6.00 | 88 | 2200 | — | 1.12 | 27 | 120 |
| 0.33 | 4.0 | 7.22 | 107 | 4800 | 1.50 | 1.36 | 37 | 97 |
| 0.33 | 4.0 | 7.25 | 115 | 2750 | — | 1.36 | 33 | 114 |
| 0.33 | 4.0 | 7.30 | 103 | 3200 | — | 1.36 | 33 | 109 |
| 0.33 | 6.0 | 9.81 | 133 | 2800 | — | 1.84 | 38 | 115 |
| 0.33 | 8.0 | 12.4 | 150 | 3300 | — | 2.32 | 40 | 116 |
| 0.66 | 4.0 | 7.61 | 134 | 3830 | 1.474 | 1.44 | 45 | 95 |
| 0.66 | 4.0 | 7.61 | 117 | 2800 | — | 1.44 | 41 | 103 |
| 0.66 | 4.0 | 7.61 | 117 | 2800 | — | 1.44 | 41 | 104 |
| 0.66 | 4.0 | 7.61 | 129 | 3100 | — | 1.44 | 42 | 105 |
| 0.66 | 4.0 | 7.61 | 125 | 3000 | — | 1.44 | 41 | 107 |
| 0.66 | 6.0 | 10.2 | 169 | 3880 | 1.465 | 1.92 | 54 | 98 |
| 1.0 | 4.0 | 8.0 | 129 | 3100 | — | 1.52 | 46 | 106 |
| 1.0 | 4.0 | 8.0 | 133 | 3990 | 1.466 | 1.52 | 48 | 100 |
| 1.0 | 6.0 | 10.7 | 171 | 4615 | 1.509 | 2.00 | 60 | 101 |
| 1.5 | 4.0 | 8.8 | 124 | 2850 | — | 1.66 | 50 | 108 |

The surprising and unexpected results of the present invention are exemplified by the data of Table 1, which illustrate that the use of di-t-butylperoxide in the DES-oxygen system results in the deposition of silicon dioxide at a rate greater than 30 angstroms per minute at only 250° C., which is the deposition rate for DES-oxygen without the use of a promoter at 350° C., as set forth in Example 1 of the '724 patent. In addition, the films of the examples according to Table 1 show adequate properties as indicated by their refractive indices greater than 1.43. By comparison, thermal silicon dioxide has a refractive index of generally 1.460, at best 1.465, and silicon dioxide films deposited using tetraethoxysilane (TEOS) have refractive indices from 1.42 to 1.45.

The data of Table 1 also show that increasing the ratio of additive to DES increases the deposition rate. However, additional oxygen also must be added to achieve the higher rates, since the promoter has increased the percentage DES converted to react with oxygen.

Set forth in Table 2 is a series of runs to determine silicon dioxide deposition step coverage data as a function of promoter, Add/DES, residence time, and deposition temperature. The 315° C. temperature using t-buOOH, and the deposition temperature of 270° C. using nbuNO$_2$ are consistent with Equations 1–3 using rate constants for these additives. Add/DES and O$_2$/DES are as defined for Table 1. Trench H/W is the nominal aspect ratio of a trench etched into a silicon wafer. For H/W=2, the trenches were 7 μm deep. For H/W=6, 7 and 8, the trenches nominally were 6 μm deep. The % step coverages were obtained from scanning electron microscope micrographs.

| Add. | Temp °C | Add/ DES | O$_2$/ DES | Total Flow sccm | Res. time sec | Film Thick A | P$_{total}$ Torr | Trench H/W | % Step Cov. X | Y | Z | Run # |
|---|---|---|---|---|---|---|---|---|---|---|---|---|
| none | 415 | — | 2.0 | 7.2 | 0.5 | 4270 | 0.90 | 2 | 74 | 70 | 79 | 74 |
|  |  |  |  |  |  |  |  | 6 | 36 | 35 | 40 |  |
| none | 415 | — | 2.0 | 3.70 | 1.0 | 4860 | 0.90 | 2 | 71 | 68 | 78 | 69 |
|  |  |  |  |  |  |  |  | 7 | 31 | 30 | 31 |  |
| none | 415 | — | 2.0 | 1.81 | 2.0 | 4510 | 0.90 | 2 | 81 | 76 | 87 | 76 |
|  |  |  |  |  |  |  |  | 7 | 39 | 38 | 40 |  |
| helium | 415 | 20.0 | 2.0 | 25.7 | 1.0 | 4370 | 6.45 | 2 | 80 | 81 | 75 | 71 |
|  |  |  |  |  |  |  |  | 7 | 39 | 37 | 36 |  |
| t-buOOH | 315 | 0.1 | 2.0 | 4.4 | 2.0 | 3330 | 1.80 | 2 | 60 | — | 60 | 44 |
|  |  |  |  |  |  |  |  | 7 | 32 | 36 | 42 |  |
| t-buOOH | 315 | 0.2 | 2.0 | 4.5 | 1.0 | 3080 | 0.91 | 2 | 54 | 51 | 60 | 45 |
|  |  |  |  |  |  |  |  | 7 | 27 | 25 | 35 |  |
| t-buOOH | 315 | 0.2 | 2.0 | 4.5 | 2.0 | 2590 | 1.83 | 2 | 81 | 74 | 93 | 43 |
|  |  |  |  |  |  |  |  | 7 | 46 | 39 | 47 |  |
| nbuNO$_2$ | 270 | 0.2 | 2.0 | 2.4 | 0.95 | 2770 | 0.44 | 2 | 74 | 69 | 66 | 56 |
|  |  |  |  |  |  |  |  | 7 | 46 | 46 | — |  |
| nbuNO$_2$ | 270 | 0.4 | 2.0 | 5.1 | 0.95 | 2950 | 0.93 | 2 | 68 | 68 | 87 | 57 |
|  |  |  |  |  |  |  |  | 7 | 39 | 33 | 39 |  |
| (t-buO)$_2$ | 250 | 0.33 | 4.0 | 7.2 | 1.0 | 3990 | 1.36 | 2 | 67 | 62 | 73 | 97 |
|  |  |  |  |  |  |  |  | 7 | 40 | 37 | 38 |  |
| (t-buO)$_2$ | 250 | 0.66 | 4.0 | 7.6 | 1.0 | 2860 | 1.44 | 2 | 68 | 63 | — | 95 |
|  |  |  |  |  |  |  |  | 8 | 40 | 41 | — |  |
| (t-buO)$_2$ | 250 | 0.66 | 6.0 | 10.2 | 1.0 | 4630 | 1.27 | 2 | 41 | 38 | 33 | 99 |
|  |  |  |  |  |  |  |  | 7 | 30 | 29 | 29 |  |
| (t-buO)$_2$ | 250 | 1.0 | 4.0 | 8.0 | 1.0 | 3800 | 1.52 | 2 | 50 | 49 | 59 | 100 |
|  |  |  |  |  |  |  |  | 7 | 33 | 31 | 34 |  |
| (t-buO)$_2$ | 250 | 1.0 | 5.0 | 5.4 | 1.0 | 3540 | 1.00 | 2 | 52 | 47 | 66 | 102 |
|  |  |  |  |  |  |  |  | 7 | 31 | 34 | 34 |  |
| (t-buO)$_2$ | 250 | 1.0 | 6.0 | 10.7 | 1.0 | 3960 | 2.00 | 2 | 58 | 57 | 69 | 101 |
|  |  |  |  |  |  |  |  | 7 | 40 | 37 | 43 |  |

In reviewing Table 2, reference should be taken to the drawing that shows a substrate 8 with a conventional trench for determining film deposition conformality. As shown in the drawing, the trench has a top surface 10 and a bottom surface 12 with a wall portion 14. The layer of silicon dioxide deposited on the substrate is indicated by 16 and is deposited from the top 10 to the bottom 12. The trench dimensions for determining the conformality are taken at locations X, Y and Z in the trench as shown in the drawing. The height of the trench is indicated by the dimension H and the width by the dimension W. The location X represents a spot halfway down the trench, and the location Y represents a spot 80% to the bottom of the trench, and the location Z represents the bottom of the trench. Conformality, or step coverage, is determined by film thickness at the measured position divided by the film thickness at the top surface 10 of the substrate 8 multiplied by 100.

From the data of Table 2, it can be observed that the use of additives provide films of acceptable conformality at lower temperatures than those films deposited without use of promoters. The experimental parameters were not optimized to produce improved conformalities, but a comparison of run 43 in Table 2 using t-buOOH with higher temperature runs 69, 74 and 76 without additives shows that improved conformalities are obtainable.

Thus, according to the present invention, the use of the promoters permits the deposition of silicon dioxide utilizing the diethylsilane and oxygen system at significantly reduced temperatures without sacrificing film quality or deposition conformality.

Having thus described our invention, what is desired to be secured by letters patent of the United States as set forth in the appended claims.

We claim:

1. A method for depositing silicon dioxide on a substrate in a chemical vapor deposition reactor utilizing oxygen-silicon source reactant(s) consisting essentially of the steps of:

maintaining conditions of temperature, pressure and rate of introduction of said oxygen-silicon source reactant (s) into said reactor for deposition of silicon dioxide on said substrate in said reactor;

introducing a promoter, selected from the group consisting of peroxide, hydroperoxide, nitrite and mixtures thereof, that will generate free radicals into said reactor to accelerate deposition rate and/or lower deposition temperature, said promoter having a lifetime approximately equal to a residence time of said oxygen-silicon source reactant(s) in said reactor;

generating said free radicals from said promoter in said reactor; and reacting said free radicals in said chemical vapor deposition reactor with said oxygen-silicon source reactant (s) to deposit silicon dioxide on said substrate.

2. A method according to claim 1 wherein said method is carried out by maintaining said reactor at a temperature in a range of approximately 250° C. (482° F.) to 420° C. (788° F.).

3. A method according to claim 1 wherein said method is carried out by maintaining said reactor at a temperature of approximately 250° C. (482° F.).

4. A method according to claim 1 wherein said promoter is selected from the group consisting of di-t-butylperoxide, t-butylhydroperoxide, n-butylnitrite and mixtures thereof.

5. A chemical vapor deposition method, comprising the steps of:

heating a substrate upon which deposition is desired to a temperature in a range of at least 250° C. (482° F.) in a vacuum having a pressure in a range of from about 0.1 to about 2.00 torr;

introducing into said vacuum: (i) a silane selected from the group consisting of alkylsilane, arylsilane, alkoxysilane and aralkylsilane wherein the alkyl-, aryl-, alkoxy- or aralkyl- moiety comprises from 2–6 carbons, and (ii) a source of oxygen;

adding to said silane and said source of oxygen a free radical promoter selected from the group consisting of di-t-butylperoxide, t-butylhydroperoxide, n-butylnitrite and mixtures thereof, wherein a volume ratio of said free radical promoter to said silane is between 0.1 and 1.0; and maintaining said temperature and pressure in said ranges thereby causing a film of silicon dioxide to deposit on said substrate.

6. The method of claim 5 wherein said film of silicon dioxide has a refractive index of approximately 1.46.

7. The process of claim 5 wherein the temperature of the substrate is maintained between 250° C. (482° F.) and 420° C. (788° F.).

8. A chemical vapor deposition method, comprising the steps of:

heating a substrate upon which deposition is desired to a temperature in a range of at least 250° C. (480° F.) in a vacuum having a pressure in a range of from about 0.1 torr to about 2.00 torr;

introducing into said vacuum a flow of reactants of diethylsilane and oxygen together with an effective amount of a free radical promoter selected from the group consisting of di-t-butylperoxide, t-butylhydroperoxide, n-butylnitrite and mixtures thereof; and maintaining said temperature and vacuum in said ranges and flow of reactants and promoter until a layer of silicon dioxide is deposited on said substrate.

9. The method of claim 8 wherein said free radical promoter is di-t-butylperoxide added in a volume ratio of 0.1 to 2.0 relative to said diethylsilane.

10. The method of claim 8 wherein said free radical promoter is t-butylhydroperoxide added in a volume ratio of 0.1 to 2 relative to said diethylsilane and said substrate is heated to approximately 315° C. (600° F.).

11. The method of claim 8 where said free radical promoter is n-butylnitrite added in a volume ratio of 0.2 to 0.4 relative to said diethylsilane and said substrate is heated to approximately 270° C. (518° F.).

12. The method of claim 8 wherein the a volume ratio of said oxygen to said diethylsilane introduced into said vacuum is between 1.0 and 6.0.

* * * * *